United States Patent [19]
Fujioka et al.

[11] Patent Number: 5,946,587
[45] Date of Patent: Aug. 31, 1999

[54] CONTINUOUS FORMING METHOD FOR FUNCTIONAL DEPOSITED FILMS

[75] Inventors: Yasushi Fujioka; Shotaro Okabe, both of Nara; Masahiro Kanai, Soraku-gun; Takehito Yoshino, Nara; Akira Sakai, Soraku-gun; Tadashi Hori, Tsuzuki-gun, all of Japan

[73] Assignee: Canon Kabushiki Kaisha, Tokyo, Japan

[21] Appl. No.: 08/741,352

[22] Filed: Oct. 29, 1996

Related U.S. Application Data

[63] Continuation of application No. 08/416,468, Apr. 4, 1995, abandoned, which is a continuation of application No. 08/101,018, Aug. 3, 1993, abandoned.

[30] Foreign Application Priority Data

Aug. 6, 1992 [JP] Japan ..................................... 4-231314

[51] Int. Cl.⁶ ................................................. C23C 16/00
[52] U.S. Cl. ........................... 438/513; 438/514; 438/531; 438/535; 438/565; 427/569; 427/582; 427/255.5; 204/102.25
[58] Field of Search ..................................... 427/569, 582, 427/255.5; 437/36, 37, 80, 205, 730; 438/513, 514, 531, 535, 565; 204/102.25

[56] References Cited

U.S. PATENT DOCUMENTS

| | | | |
|---|---|---|---|
| 4,438,723 | 3/1984 | Cannella et al. | 118/718 |
| 4,462,332 | 7/1984 | Nath et al. | 118/718 |
| 4,480,585 | 11/1984 | Gattuso | 118/719 |
| 4,485,125 | 11/1984 | Izu et al. | 427/74 |
| 4,519,339 | 5/1985 | Izu et al. | 118/718 |
| 4,677,738 | 7/1987 | Izu et al. | 29/572 |
| 4,717,586 | 1/1988 | Ishihara et al. | 427/39 |
| 4,728,528 | 3/1988 | Ishihara et al. | 427/39 |
| 4,771,015 | 9/1988 | Kanai et al. | 437/109 |
| 4,772,486 | 9/1988 | Ishihara et al. | 427/39 |
| 4,772,570 | 9/1988 | Kanai et al. | 437/109 |
| 4,778,692 | 10/1988 | Ishihara et al. | 427/53.1 |
| 4,784,874 | 11/1988 | Ishihara et al. | 427/49 |
| 4,801,468 | 1/1989 | Ishihara et al. | 427/35 |
| 4,818,563 | 4/1989 | Ishihara et al. | 427/55 |
| 4,830,890 | 5/1989 | Kanai | 427/255.1 |
| 4,842,897 | 6/1989 | Takeuchi et al. | 427/255.2 |
| 4,851,302 | 7/1989 | Nakagawa et al. | 428/658 |
| 4,853,251 | 8/1989 | Ishihara et al. | 427/38 |
| 4,873,125 | 10/1989 | Matsuyama et al. | 427/248.1 |
| 4,913,928 | 4/1990 | Sugita et al. | 427/39 |
| 4,951,602 | 8/1990 | Kanai | 118/719 |
| 4,971,832 | 11/1990 | Arai et al. | 427/39 |

FOREIGN PATENT DOCUMENTS

| | | | |
|---|---|---|---|
| 0041773 | 12/1981 | European Pat. Off. | H01L 31/18 |
| 62-36633 | 8/1987 | Japan . | |
| 0330419 | 2/1991 | Japan . | |

*Primary Examiner*—Benjamin Utech
*Attorney, Agent, or Firm*—Fitzpatrick, Cella, Harper & Scinto

[57] ABSTRACT

The present invention aims to provide a continuous forming method and apparatus for functional deposited films having excellent characteristics while preventing any mutual mixture of gases between film forming chambers having different pressures, wherein each of semiconductor layers of desired conduction type is deposited on a strip-like substrate within a plurality of film forming chambers, by plasma CVD, while the strip-like substrate is being moved continuously in a longitudinal direction thereof through the plurality of film forming chambers connected via a gas gate having the structure of introducing a scavenging gas into a slit-like separation passage, characterized in that at least one of the gas gates connecting the i-type layer film forming chamber for forming the semiconductor junction and the n- or p-type layer film forming chamber having higher pressure than the i-type layer film forming chamber has the scavenging gas introducing position disposed on the n- or p-type layer film forming chamber side off the center of the separation chamber of the gas gate.

24 Claims, 10 Drawing Sheets

CONTINUOUS FORMING METHOD FOR FUNCTIONAL DEPOSITED FILMS

This application is a continuation of application Ser. No. 08/416,468 filed Apr. 4, 1995, now abandoned, which is a continuation of application Ser. No. 08/101,018 filed Aug. 3, 1993, now abandoned.

BACKGROUND OF THE INVENTION

1. Field of the Invention

The present invention relates to a method for continuously forming functional deposited films such as for a photovoltaic element and a deposition apparatus, and more particularly to a method for continuously forming functional deposited films such as for a large area photovoltaic element on a substrate and a deposition apparatus.

2. Related Background Art

Conventionally, deposited film forming apparatuses of three chamber separation type have been well known, in which functional deposited films, such as for a photovoltaic element, are formed on a substrate by passing them consecutively through film forming chambers which are completely separated by a gate valve to form a semiconductor in order to improve the characteristics of the semiconductor. These film forming chambers were superior in preventing contamination with impurities but resulted in less productivity. Therefore, to form a semiconductor device such as a photovoltaic element on a strip-like substrate, a continuous film forming apparatus for continuously forming predetermined functional deposited films has been proposed in which the strip-like substrate is continuously conveyed from a strip-like substrate container to a plurality of reaction vessels each of which forms a predetermined semiconductor film thereon, and then received within another strip-like substrate container.

In Japanese Patent Publication No. 62-36633, for example, a continuous plasma CVD method adopting the Roll to Roll system has been disclosed. According to this method, a photovoltaic element having semiconductor junctions can be continuously formed in which a plurality of glow discharge regions are provided, a longitudinally extending strip-like substrate of desired width is arranged along a passage passing through the plurality of glow discharge regions in sequence, and then a semiconductor of a desired conduction type is deposited in each glow discharge region while the substrate is continuously conveyed in its longitudinal direction. In this Japanese Patent Publication, a gas gate is used for preventing the diffusion or contamination of impurity gases for the formation of a semiconductor layer into other glow discharge regions. Specifically, the plurality of glow discharge regions as above-described are separated by a slit-like separation passage, and, means is further provided for forming a flow of a scavenging gas such as Ar or $H_2$ into the separation passage.

In this case, however, when a pressure difference is present from one film forming chamber to another in the gas gate, the problem arises that a film forming gas is prone to transfer from a higher pressure film forming chamber to a lower pressure film forming chamber.

To counter this problem, a conventionally adopted solution was such that the adjacent film forming chambers were equalized in pressure to eliminate such pressure difference, or the film forming chamber was placed at higher pressure to prevent the inflow of a gas from the adjacent film forming chamber, as disclosed in U.S. Pat. No. 4,438,723.

This apparatus is a continuous film forming apparatus for continuously forming semiconductor layers having p-, i-, or n-type conductiveness (hereinafter referred to as a p-type layer, an i-type layer and an n-type layer), for example, on a strip-like substrate, comprising a first reaction vessel for forming the p-type semiconductor layer, a second reaction vessel for forming the i-type semiconductor layer, and a third reaction vessel for forming the n-type semiconductor layer, wherein between the first deposited films.

As a proposal for solving these problems in the continuous film forming apparatus as described in U.S. Pat. No. 4,438,723 a continuous film forming apparatus having gas gate means has been disclosed in U.S. Pat. No. 4,462,332. The apparatus comprises a plurality of reaction vessels (i.e., a p-type semiconductor layer forming reaction vessel, an i-type semiconductor layer forming reaction vessel and an n-type semiconductor layer forming reaction vessel), wherein the gas gate means is provided between the adjacent reaction vessels, adjacent the i-type semiconductor layer forming reaction vessel. This gas gate means is to prevent the mutual diffusion of film forming source gases for use in respective reaction vessels, having a structure of causing a gate gas to be introduced in only one direction to flow toward the p-type or n-type semiconductor layer forming reaction vessel. Also, the continuous film forming apparatus is provided with a magnet at an upper wall of the passage for the strip-like substrate through the gas gate means, whereby the strip-like substrate is brought into contact with the upper wall of the passage to reduce the size of the passage. This continuous film forming apparatus can solve some of the problems with the continuous film and second reaction vessels, and between the second and third reaction vessels, separating means is provided for preventing an element constituting the p-type semiconductor layer and an element constituting the n-type semiconductor layer from mixing into the second reaction vessel, respectively, with the pressure of the second reaction vessel made higher than those of the first and third reaction vessels to effect the operation. The use of such continuous film forming apparatus allows a plurality of semiconductor layers having different compositions to be continuously laid down one over the other. The separating means is to isolate the adjacent reaction vessels from each other by providing a predetermined difference in internal pressure between the adjacent reaction vessels, thereby preventing the mutual diffusion of source gases for use in the reaction vessels. In this case, however, there is a problem with the separating means. There is a passage for the strip-like substrate provided through the adjacent reaction vessel, through which a source gas within the reaction vessel of the higher internal pressure inevitably mixes into the reaction vessel of the lower internal pressure. This causes variations in the internal pressure within the latter reaction vessel, as well as in the plasma excited within the reaction vessel, so that it is difficult to form desired forming apparatus as described in U.S. Pat. No. 4,438,723, to some extent, but precise control of relevant parameters, such as the conductance of the gas gate means or the flow rate of the gate gas, is required to to prevent the mutual diffusion of the source gases used across the adjacent reaction vessels. That is, for example, when a semiconductor photoelectric conversion element having a pin junction with high conversion efficiency is fabricated, it is necessary that the p-type and n-type semiconductor layers are relatively thin, and the i-type semiconductor layer is considerably thick, wherein each of the p-type and n-type semiconductors is formed by RF plasma CVD, for example, and the i-type semiconductor is formed by microwave plasma CVD which is capable of effecting fast film formation. In this case, the internal pressure of the i-type semiconductor forming reaction vessel at the film formation, is significantly lower than that of the p-type and n-type semiconductor forming reaction vessels at the film formation. Therefore, it is required to prevent the inflow of impurities introducing source gases for use in the p-type and n-type semiconductor forming reaction vessels into the i-type semiconductor layer forming reaction vessel. However, this requirement is quite difficult to be met with the continuous film forming apparatus as described in U.S. Pat. No. 4,438,723. That is, in the continuous film forming apparatus as above described, the gas gate means is provided on either side of an i-type semiconductor device, causing a gate gas to flow via the gate gas means in the directions toward the p-type and n-type semiconductor forming reaction vessels. When the internal pressure of the i-type semiconductor forming reaction vessel is significantly lower than that of the p-type and n-type semiconductor forming reaction vessels, a reverse flow of a gas is caused, so that a p- or n-type impurities introducing source gas for use in the p-type or n-type semiconductor forming reaction vessel may mix into the i-type semiconductor forming reaction vessel. To solve this problem, a proposal has been made in Japanese Laid-Open Patent Application No. 3-30419 in which the gas gate means is provided centrally between the adjacent reaction vessels, so that a gate gas is introduced from above and exhausted downward. A continuous film forming apparatus, according to this proposal, is comprised of a p-type semiconductor forming reaction vessel by the RF plasma CVD, an i-type semiconductor forming reaction vessel by the microwave plasma CVD and an n-type semiconductor forming reaction vessel by the RF plasma CVD, wherein the gas gate means is provided centrally between the p-type semiconductor forming reaction vessel by the RF plasma CVD and the i-type semiconductor forming reaction vessel by the microwave plasma CVD, and another gas gate means is provided centrally between the i-type semiconductor forming reaction vessel by the microwave plasma CVD and the n-type semiconductor forming reaction vessel by the RF plasma CVD. However, in order that the gas gate means provided in the continuous film forming apparatus may exhibit sufficient effects of preventing the diffusion of source gases for use in the adjacent reaction vessels, it is necessary to decrease the conductance of a slit portion of the gas gate means, and/or increase the flow rate of the gate gas. However, in doing so, there is still a problem to be solved. That is, the problem with the conductance of the slit portion is such that the conductance of the slit portion is governed by the shape of the slit portion so as to decrease in proportion to the length of the slit portion in the conveying direction of the strip-like substrate, and increase in proportion to the square of the height of the slit portion in a thickness direction of the strip-like substrate. Further the size of the slit in a width direction of the strip-like substrate cannot be narrowed more than necessary due to the width of the strip-like substrate. Additionally, if the conductance of the slit portion is to be decreased, a problem arises that the strip-like substrate will inevitably vibrate or fluctuate in conveying the strip-like substrate. Therefore, in order to convey the strip-like substrate without contact of the film formation face with the wall face of the slit portion, it is necessary to provide a clearance of at least about 1 mm or more between the film formation face of the strip-like substrate and the wall face of the slit portion opposed to the film formation face. However, the provision of such clearance is naturally limited. Also, to decrease the conductance of the slit portion, it is conceived that the slit portion may be lengthened, but as the conductance only decreases in proportion to its length, the slit portion becomes quite longer, and the gas gate means becomes quite bulky so as and impractical. Also, the problem with the flow rate of the gate gas is such that when the flow rate of the gate gas is increased, the inflow rate of the gate gas into each reaction vessel correspondingly increases. In this case, a problem arises that the desired deposited film is difficult to form since variations are cause in the film forming conditions for each reaction vessel, including, for example, the internal pressure, the rate of dilution of the source gas, and the plasma state. To solve such problems, it is conceived that the exhausting ability of an exhauster used may be enhanced, but the exhauster may necessarily become larger in taking such a measure. Accordingly, this continuous film forming apparatus also has another problem to be solved.

SUMMARY OF THE INVENTION

An object of the present invention is to solve aforementioned problems in the conventional methods for continuously forming photovoltaic elements with the Roll to Roll system. A further object is to provide a method and apparatus for continuously forming functional deposited films, such as for a photovoltaic element, which is capable of carrying out the processes involving different pressures in a continuous operation with high producibility, while preventing the mutual mixture of impurity gases between film forming chambers.

The present invention provides a functional deposited film forming method in which each of functional deposited films is deposited on a strip-like substrate within a plurality of film forming chambers, while the strip-like substrate is being moved continuously in a longitudinal direction thereof through the plurality of film forming chambers and a gas gate for connecting between the film forming chambers, wherein the introducing position of a scavenging gas is located on the high pressure film forming chamber side off the center of a separation passage for the gas gate, connecting between a high pressure film forming chamber for forming low resistance semiconductor and a low pressure film forming chamber for forming a high resistance semiconductor which constitute the plurality of film forming chambers, in a movement direction of the strip-like substrate, for the introduction of the scavenging gas.

A functional deposited film forming method wherein the deposited film forming method in the film forming chamber is any one of an RF plasma CVD method, a microwave plasma CVD method, a sputtering method, an ion plating method, a photo assisted CVD method, heating CVD method, a MOCVD method, a MBE method, a vacuum CVD method and an electron vapor deposition, and wherein the low resistive semiconductor is a semiconductor of p- or n-type conductiveness, and the high resistive semiconductor is a semiconductor of i-type conductiveness.

A functional deposited film forming method in which the functional deposited film is a photovoltaic element is preferred.

A functional deposited film forming method in which the pressure difference between the high pressure film forming chamber and the low pressure film forming chamber is from 0.1 Torr to 1.1 Torr.

A functional deposited film forming method in which the pressure difference between the high pressure film forming chamber and the low pressure film forming chamber is from 0.2 Torr is preferred to 1.0 Torr.

A functional deposited film forming method in which the ratio of distance from the scavenging gas introducing position to the high pressure film forming chamber relative to the total length of the gas gate in the substrate conveying direction is from 0.1 to 0.4.

Also, the present invention provides a functional deposited film deposition apparatus, comprising a plurality of film forming chambers, a gas gate having a slit-like separation passage connecting the plurality of film forming chambers, conveying means for continuously conveying a strip-like substrate in a longitudinal direction thereof to pass through the plurality of film forming chambers and the gas gate, gas introducing means for introducing a scavenging gas into the gas gate, and depositing means for depositing each of the functional deposited films on the strip-like substrate within each of the plurality of film forming chambers, characterized in that the plurality of film forming chambers are comprised of a high pressure film forming chamber for forming low resistive semiconductor and a low pressure film forming chamber for forming high resistive semiconductor, and the introducing position of the scavenging gas is provided on the high pressure film forming chamber side off the center of the separation passage of the gas gate.

A functional deposited film deposition apparatus wherein the film forming chamber employs any one of RF plasma CVD, microwave plasma CVD, sputtering, ion plating, photo assisted CVD, thermal CVD, MOCVD, MBE, vacuum vapor deposition and electron vapor deposition is an aspect of this invention.

A functional deposited film deposition apparatus wherein the low resistive semiconductor film forming chamber is a semiconductor chamber of p- or n-type conductiveness, and the high resistive semiconductor film forming chamber is a semiconductor chamber of i-type conductiveness is another aspect of this invention.

A functional deposited film deposition apparatus in which the functional deposited film is a photovoltaic element is part of this invention.

A functional deposited film deposition apparatus in which the pressure difference between the high pressure film forming chamber and the low pressure film forming chamber is from 0.1 Torr to 1.1 Torr is yet another aspect of this invention.

A functional deposited film deposition apparatus in which the pressure difference between the high pressure film forming chamber and the low pressure film forming chamber is from 0.2 Torr to 1.0 Torr is a preferred part of the invention.

A functional deposited film deposition apparatus in which the ratio of distance from the scavenging gas introducing position to the high pressure film forming chamber relative to the total length of the gas gate in the substrate conveying direction is from 0.1 to 0.5 is part of the invention.

A functional deposited film deposition apparatus in which the ratio of distance from the scavenging gas introducing position to the high pressure film forming chamber relative to the total length of the gas gate in the substrate conveying direction is from 0.1 to 0.4 is a preferred part of the invention.

DETAILED DESCRIPTION OF THE PREFERRED EMBODIMENTS

The embodiments of the present invention will be now described with reference to the drawings.

Figure 1:
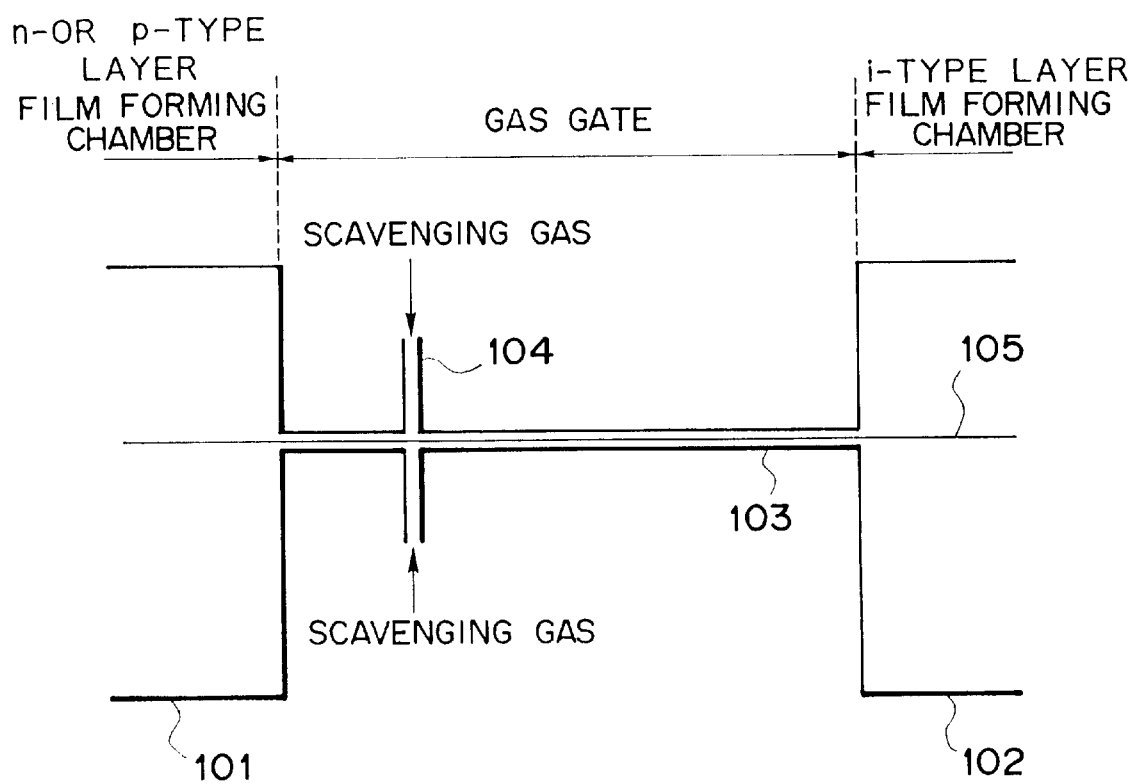
FIG. 1 is a schematic diagram showing a gas gate in a continuous forming method for functional deposited films according to the present invention.

As shown in FIG. 1, the present invention relates to a method for continuously forming functional deposited films to continuously fabricate a photovoltaic element having semiconductor junctions, in which a semiconductor layer of desired conduction type is deposited on a strip-like substrate 105 within each of a plurality of film forming chambers 101, 102, by plasma CVD, while the strip-like substrate 105 is being moved continuously in a longitudinal direction thereof to pass through the plurality of film forming chambers 101, 102 connected via gas gate 103 having an introducing portion of a scavenging gas in a slit-like separation passage, wherein the gas gate 103 for connecting an i-type layer film forming chamber 102 for forming semiconductor junctions and an n- or p-type layer film forming chamber 101 having higher pressure than the i-type layer film forming chamber has an introducing tube 104 of the scavenging gas provided on the n- or p-type layer film forming chamber side off the center of the separation passage for the gas gate 103 to introduce the scavenging gas thereinto, thereby enhancing the gas separation performance of the gas gate and effectively preventing impurity gases from the film forming chamber 101 from mixing into the i-type layer film forming chamber 102.

Figure 2:
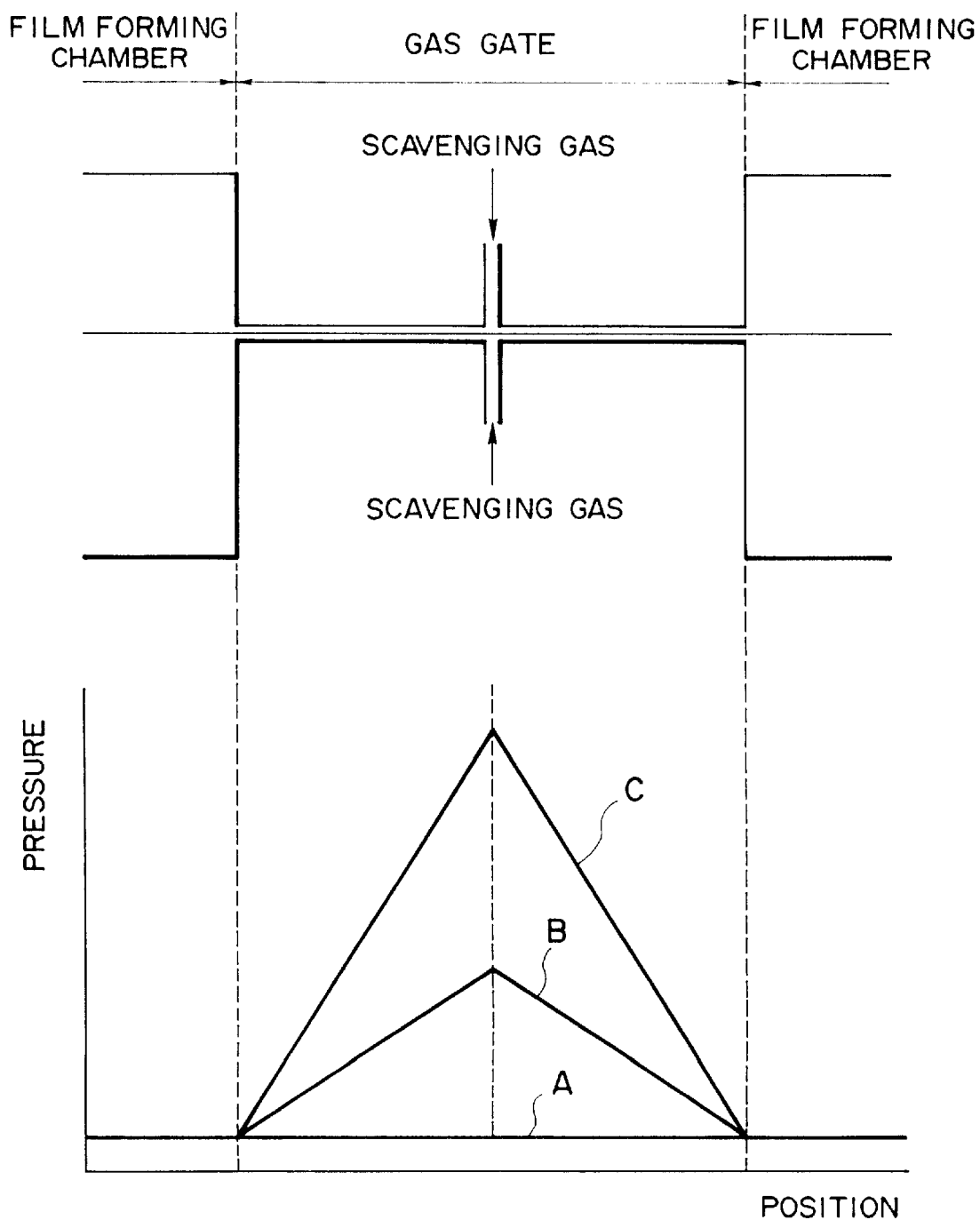
FIG. 2 is a schematic diagram showing the relationship between the pressure distribution within the gas gate and the gas flow or gas introducing position in a conventional continuous forming apparatus.

When two film forming chambers connected via the gas gate have identical pressure, the pressure in the separation passage within the gas gate will be a maximum at the introducing position of the scavenging gas, as shown in FIG. 2, if the scavenging gas is introduced. As shown in FIG. 2, if the scavenging gas is increased from A to B to C, the pressure at the introducing position of the scavenging gas increases in accordance with the introducing amount of the scavenging gas, forming a flow of gas from the scavenging gas introducing position to each of two film forming chambers, so that the gases within two film forming chambers can be prevented from mixing with each other.

Figure 3:
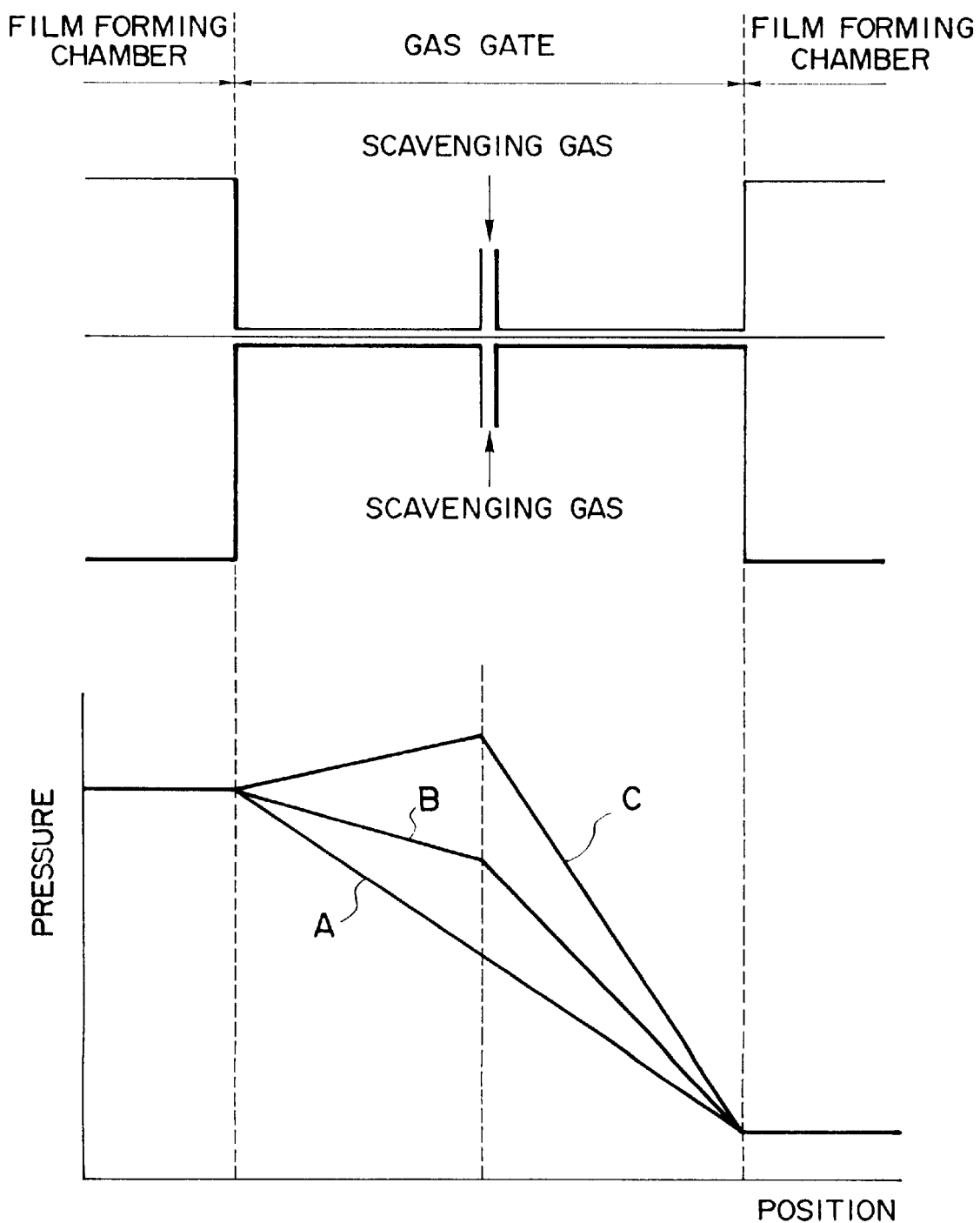
FIG. 3 is a schematic diagram showing the relationship between the pressure distribution within the gas gate and the gas flow or gas introducing position.

However, when there is a pressure difference between two film forming chambers connected via the gas gate, the pressure in the separation passage within the gas gate does not necessarily become maximum at the scavenging gas introducing position when the scavenging gas is introduced. The pressure distribution within the gas gate changes with the flow rate of the scavenging gas, as shown in FIG. 3, in which A is indicated when no scavenging gas flows B indicated when a small quantity flows, and C indicated when a large quantity flows, wherein when a small quantity of the scavenging gas is provided, the pressure in the separation passage within the gas gate becomes maximum at the aperture on the higher pressure film forming chamber side among two film forming chambers having a pressure difference.

With a method as disclosed in U.S. Pat. No. 4,438,723 teaching that pressure difference is provided between two film forming chambers connected via the gas gate, the scavenging gas is blown into a gas gate aperture for a film forming chamber having higher pressure (hereinafter referred to as a higher pressure film forming chamber) among two film forming chambers having a pressure difference, so that the pressure in the separation passage within the gas gate becomes maximum at the aperture on the higher pressure film forming chamber side.

In this way, when there is some pressure difference between two film forming chambers connected via the gas gate, the pressure distribution within the gas gate is not consistent, unlike the case where no pressure difference exists.

Figure 5:
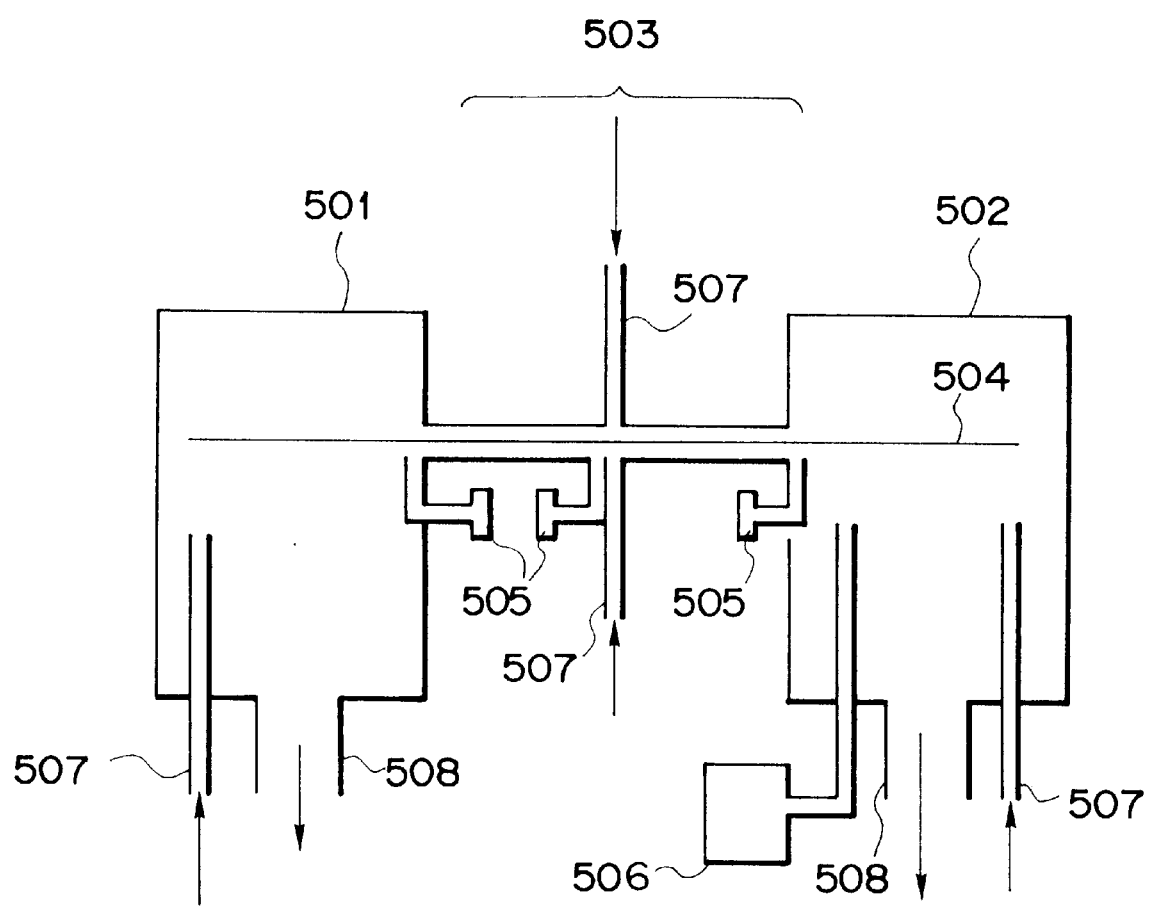
FIG. 5 is a schematic view showing an apparatus for investigating the relationship between the pressure distribution within the gas gate and the gas separation performance.

Thus, the present inventors have examined the relationship between the pressure distribution within the gas gate and the gas separation performance, using an apparatus as shown in FIG. 5, in the case where there is pressure difference between two film forming chambers. In FIG. 5, 501 is a higher pressure film forming chamber, and 502 is a film forming chamber at lower pressure side among the two film forming chambers having a pressure difference (hereinafter referred to as a lower pressure film forming chamber). 503 is a gas gate, 504 is a strip-like substrate, 505 is a pressure gauge, 506 is a quadrupole mass spectrometer, 507 is a gas introducing tube, and 508 is an exhaust tube.

In this apparatus, the lower pressure film forming chamber was prefilled with $H_2$ of 200 sccm, instead of a film forming gas, and the higher pressure film forming chamber was prefilled with He of 200 sccm, instead of an impurity gas, $H_2$ was used as the scavenging gas for the gas gate to introduce each one-half amount through each of the upper and lower gas introducing tubes for the gas gate, and measure the amount of He flowing from the higher pressure film forming chamber into the lower pressure film forming chamber, using the quadrupole mass spectrometer connected to the lower pressure film forming chamber. With the small amount of He flowing into the lower pressure film forming chamber, the smaller amount of the impurity gas flows into the lower pressure film forming chamber, whereby it can evaluated that the gas separation performance between the film forming chambers is high. Also, the pressure within the gas gate was measured using pressure gauges provided in the scavenging gas introducing portion and each of the film forming chamber apertures. Note that the pressure of the lower pressure film forming chamber was constant at 5 m Torr, and that of the higher pressure film forming chamber was changed from 1 Torr to 0.75 Torr.

Figure 6:
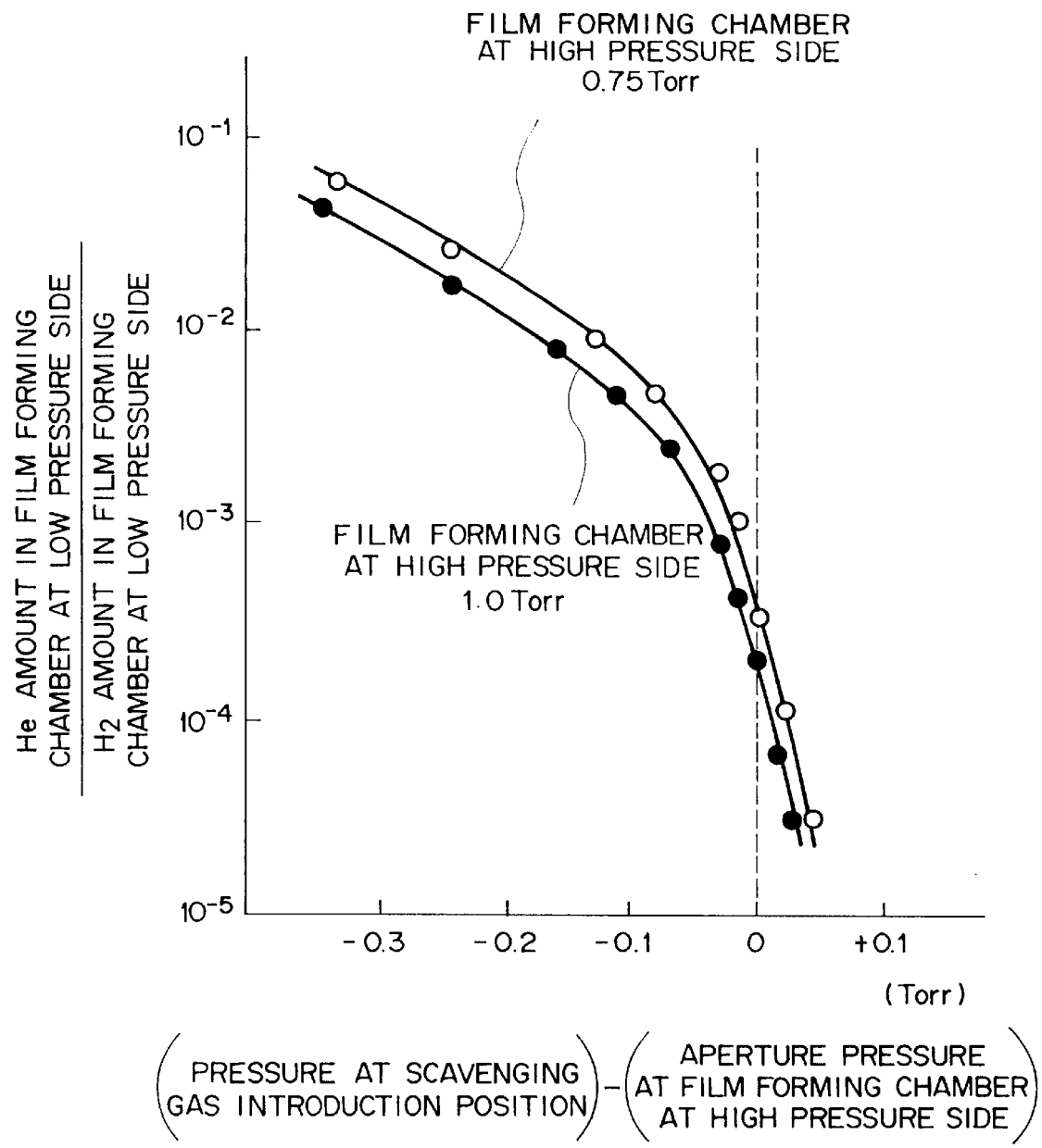
FIG. 6 is a graphic representation showing the relationship between the pressure distribution within the gas gate and the gas separation performance.

As a result, it has been found that a relationship as shown in FIG. 6 exists between the amount of the impurity gas flowing from the higher pressure film forming chamber into the lower pressure film forming chamber and the pressure within the gas gate. That is, it has been found that as the pressure at the scavenging gas introducing position increases with increasing amount of the introducing scavenging gas, the mixing amount of the impurity gas from the higher pressure film forming chamber into the lower pressure film forming chamber decreases, and the inflow of the impurity gas from the higher pressure film forming chamber into the lower pressure film forming chamber rapidly decreases in the region where the pressure at the scavenging gas introducing position is higher than that at the aperture on the high pressure film forming chamber side, so that the gas separation performance of the gas gate is rapidly improved.

Figure 4:
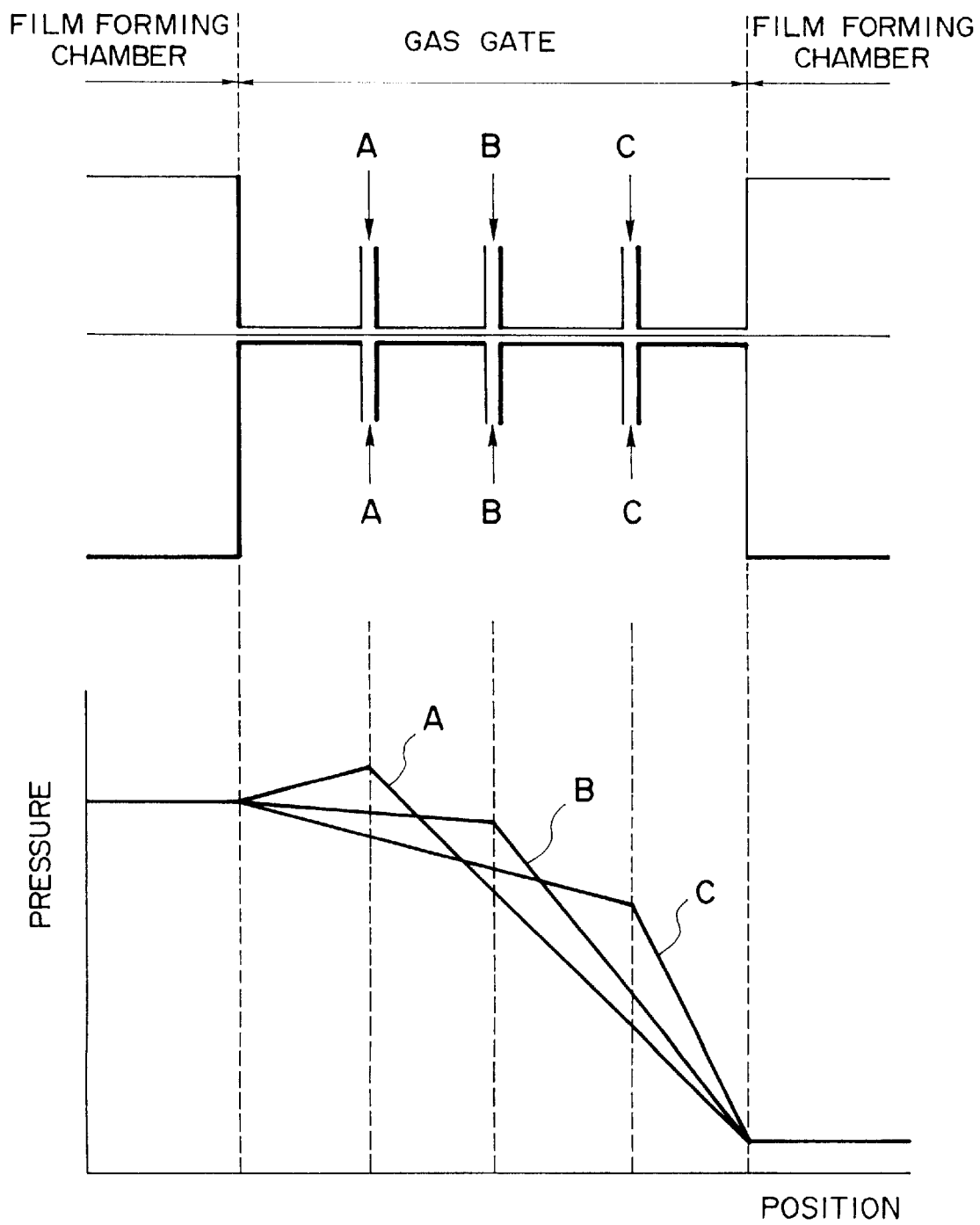
FIG. 4 is a schematic diagram showing the relationship between the pressure distribution within the gas gate and the gas flow or gas introducing position.

Further, the present inventors changed the introducing position of the scavenging gas to the center of the gas gate, the higher pressure film forming chamber side, and the lower pressure film forming chamber side, successively, while maintaining the flow of the introducing scavenging gas into the gas gate constant, and measured the pressure at the scavenging gas introducing position and the inflow of the impurity gas into the lower pressure film forming chamber, so that it has been found that the pressure at the scavenging gas introducing position increases and the amount of the introducing impurity gas into the lower pressure film forming chamber decreases if the scavenging gas is introduced into the higher pressure film forming chamber side off the center of the gas gate, while if the scavenging gas is introduced into the lower pressure film forming chamber side, the pressure at the scavenging gas introducing position decreases and the amount of the impurity gas flowing into the lower pressure film forming chamber increases, whereby there is no need of changing the length of the gas gate or the flow of the scavenging gas as shown in FIG. 4.

That is, it has been found that by introducing the scavenging gas from the n- or p-type layer film forming chamber side, differently from the center of the gas gate or the i-type layer film forming chamber side as was conventionally introduced, the pressure at the scavenging gas introducing position can be made higher than that at the aperture on the higher pressure film forming chamber side, with a smaller amount of the introducing scavenging gas, and the inflow of the impurity gas from the higher pressure film forming chamber into the lower pressure film forming chamber can be effectively decreased. The present invention has been achieved based on such an aspect.

The principle on which when there is significant pressure difference between the film forming chambers connected via the gas gate, the inflow of impurity gas into the lower pressure film forming chamber can be decreased by placing the scavenging gas introducing position closer to the higher pressure film forming chamber side, as above described, will be described below. For simplification, it is assumed that the cross-sectional shape of an aperture (width and height of a slit portion) in a perpendicular direction to the conveying direction of a strip-like substrate in the gas separation passage of the gas gate is invariant with respect to the conveying direction of the strip-like substrate, and the state where no strip-like substrate is provided is considered.

(1) The case where no pressure difference exists between film forming chambers connected via the gas gate will be considered. If no scavenging gas is introduced, the flow in the film forming chamber is only a slight diffusion of a film forming gas through the separation passage of the gas gate. In this state, if the scavenging gas is introduced into the gas gate, the introduced scavenging gas is divided in proportion to the conductance of the separation passage from the scavenging gas introducing position to each film forming chamber to flow into each film forming chamber while suppressing the diffusion of the film forming gas between the film forming chambers. It is a scavenging gas flow from the scavenging gas introducing position to the film forming chamber for introducing an impurity gas that suppresses the diffusion of the impurity gas from the film forming chamber for introducing the impurity gas into the film forming chamber for forming an intrinsic semiconductor in the flow of scavenging gas.

And with the smaller conductance of the separation passage from the scavenging gas introducing position into the film forming chamber for introducing the impurity gas, and the greater flow of the scavenging gas in the separation passage from the scavenging gas introducing position into the film forming chamber for introducing the impurity gas, the diffusion amount of the impurity gas into the film forming chamber for forming the intrinsic semiconductor will decrease. And when the scavenging gas is introduced into the center of the gas gate, the diffusion amount of impurity gas becomes minimal.

For example, supposing that the conductance of the gas gate over its entire length in the conveying direction of the strip-like substrate is C, the flow of the introducing scavenging gas into the gas gate is Q, the point of introducing the scavenging gas (the central point of an introduction inlet) is set at a point satisfying a relationship of the distance up to the film forming chamber for the introducing impurity gas: the distance up to the film forming chamber for forming the intrinsic semiconductor=x:1−x($0 \leq x \leq 1$), it will be found that the conductance is proportional to the length of a pipe, so that the conductance C' from the scavenging gas introducing position to the film forming chamber for introducing the impurity gas and the flow of the scavenging gas Q' from the scavenging gas introducing position to the film forming chamber for introducing the impurity gas are expressed as follows.

$$C'=C/x$$

$$Q'=Q(1-x)$$

With the smaller conductance C' for the separation passage from the scavenging gas introducing position to the film forming chamber for introducing the impurity gas, and the greater flow of the scavenging gas Q' in the separation passage, the diffusion amount of the impurity gas into the film forming chamber for forming the intrinsic semiconductor will decrease, wherein it is considered that the gas separation performance is proportional to Q'/C'. Because of the relationship Q'/C'=Q(1−x)/(C/x)=(Q/C)(1−x)x, the gas separation performance Q'/C' is at maximum and the diffusion amount of the impurity gas is at minimum, at x=0.5, that is, when the scavenging gas is introduced into the center of the gas gate in the case where there is no pressure difference between the film forming chambers.

Also, if there is no pressure difference between the film forming chambers, the scavenging gas is divided at a ratio of the conductance in the separation passage and flows into each film forming chamber, whereby if the scavenging gas introducing position is set on the side of the n- or p-type layer film forming chamber for introducing the impurity gas off the center of the gas gate, more the introduced scavenging gas will flow into the n- or p-type layer film forming chamber. However, the photovoltaic element has a problem that since the film thickness of the n- or p-type layer is about one-tenth that of the i-type layer, the source gas introduced into the n- or p-type layer film forming chamber is significantly less than the source gas introduced into the i-type layer film forming chamber, and when the inflow of the scavenging gas is increased, a small amount of a source gas may be diluted to low concentration by flowing the scavenging gas. For the above reason, conventionally, it was necessary that the scavenging gas be introduced into the center of the gas gate or the position closer to the i-type layer film forming chamber off the center, when there was almost no pressure difference between the film forming chambers connected via the gas gate.

(2) The case where significant pressure difference exists between the film forming chambers will be considered next.

If the scavenging gas is not introduced, the film forming gas within the high pressure film forming chamber flows through the separation passage of the gas gate into the lower pressure film forming chamber due to the pressure difference. Therefore, when the higher pressure film forming chamber is a film forming chamber for introducing the impurity gas and the lower pressure film forming chamber is a film forming chamber for the intrinsic semiconductor, the film forming chamber for the intrinsic semiconductor will have a much greater amount of the impurity gas mixed thereinto than due to the diffusion when no pressure difference exists. Accordingly, if some presence difference exists, it is first necessary to stop the inflow of the impurity gas due to pressure difference to suppress the mixture of the impurity gas. When the scavenging gas is introduced into the gas gate connecting the film forming chambers having pressure difference, the pressure distribution within the gas gate is as shown in FIG. 3. When the introducing amount of the scavenging gas is small, all the introduced scavenging gas will flow into the lower pressure film forming chamber (state B in the figure), but if the introducing amount is increased so that the pressure at the scavenging gas introducing position exceeds that within the higher pressure film forming chamber (state C), the inflow of the impurity gas from the higher pressure film forming chamber is stopped (but the diffusion remains), thereby bringing about the inflow of the scavenging gas into the higher pressure film forming chamber. If the introducing amount of the scavenging gas is increased so that the pressure P' at the scavenging gas introducing position is equal to that pressure $P_H$ within the higher pressure film forming chamber, the flow of the film forming gas is only diffusion between the film forming chambers, so that introduced scavenging gas Q will flow through the separation passage of the gas gate (conductance C"=C/(1−x)) from the scavenging gas introducing position into the film forming chamber at the lower pressure side. Accordingly, the following relationship holds:

$$P'=P_L+Q/C''=P_L+Q(1-x)/C=P_H$$

(Where $P_L$ is a pressure within the film forming chamber at the lower pressure side.) From the above relationship, it can be recognized that with the smaller value x, the pressure P' at the scavenging gas introducing position is higher, so that the mixture of the impurity gas can be prevented with the smaller scavenging gas Q, and the impurity gas is more effectively introduced at a position close to the higher pressure film forming chamber than at the center of the gas gate.

In the present invention, the position on the n- or p-type layer film forming chamber off the center of the separation passage of the gas gate means a position on the separation passage lying from an intermediate position between the i-type layer film forming chamber and the n- or p-type layer film forming chamber to the aperture for the n- or p-type layer film forming chamber, wherein since it is necessary to form a flow of the scavenging gas in the separation passage into the n- or p-type layer film forming chamber in order to prevent the impurity gas from mixing into the i-type layer film forming chamber, the scavenging gas introducing position is preferably slightly spaced away from the aperture end of the n- or p-type layer film forming chamber. Also, when there is almost no pressure difference between the film forming chambers connected via the gas gate, the scavenging gas is preferably introduced from the center of the gas gate, as previously described, while when significant pressure difference is present, it is preferably introduced at a position closer to the side of higher pressure film forming chamber for introducing the impurity gas. Accordingly, the optimal position of introducing the scavenging gas may change in the range from the center of the gas gate to the vicinity of the aperture end of the higher pressure film forming chamber, depending on the pressure of the film forming chambers connected via the gas gate. Thus, the present inventors have investigated the relationship between the scavenging gas introducing position into the gas gate and the mixing amount of the impurity gas into the film forming chamber at the lower pressure side, by changing the scavenging gas introducing position, with the scavenging gas flow rate fixed, using an apparatus as shown in FIG. 5, when there is significant pressure difference between the film forming chambers. Note that in this apparatus, the lower pressure film forming chamber was prefilled with $H_2$ of 200 sccm, instead of a film forming gas, and the higher pressure film forming chamber was prefilled with He of 200 sccm, instead of the impurity gas, $H_2$ was used as the scavenging gas for the gas gate to introduce each one-half amount through each of upper and lower gas introducing tubes for the gas gate, and to measure the amount of He flowing from the higher pressure film forming chamber to the lower pressure film forming chamber, using a quadrupole mass spectrometer connected to the lower pressure film forming chamber. Note that the pressure of the lower pressure film forming chamber was 5 m Torr within a pressure range suitable for a microwave CVD method, and the pressure of the higher pressure film forming chamber was 1 Torr within a pressure range suitable for an RF CVD method.

Figure 10:
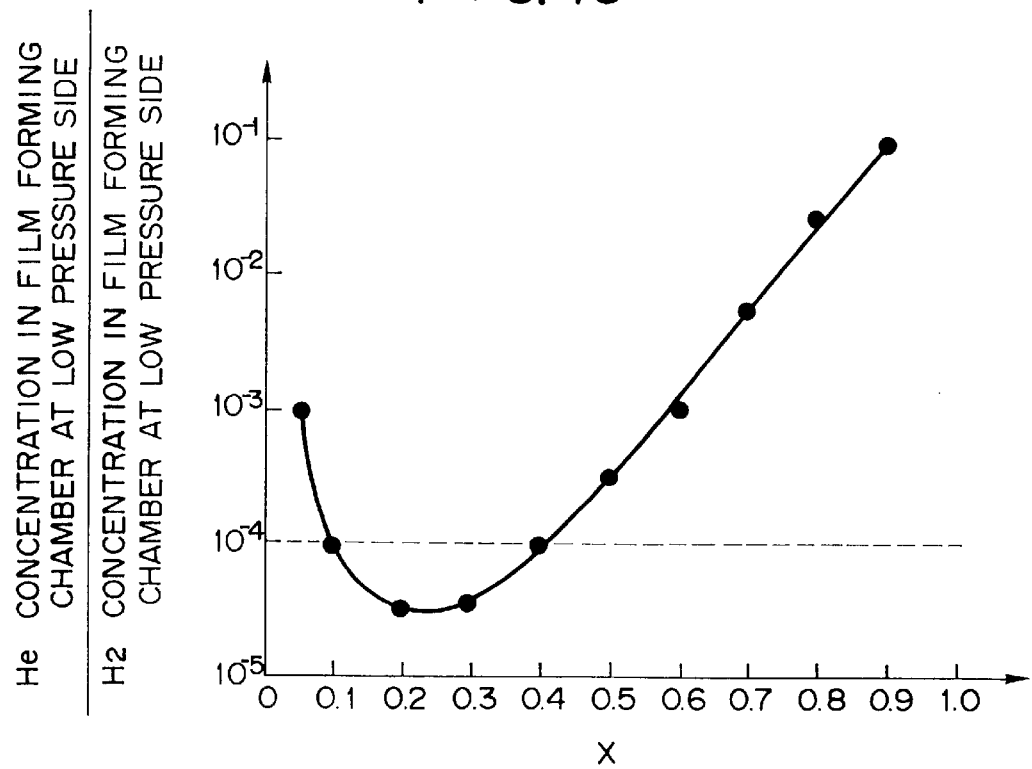
FIG. 10 is a graphic representation showing the relationship between the scavenging gas introducing position into the gas gate and the gas separation performance.

As a result, representing the scavenging gas introducing position by x as previously noted, the mixing amount of the impurity gas into the film forming chamber at the lower pressure side was changed relative to x, as shown in FIG. 10.

U.S. Pat. No. 4,438,723 has taught the practical ability of reducing impurity gas concentration which is required for the gas gate, wherein if the impurity gas concentration of the film forming chamber for introducing the impurity gas is reduced to $10^{-4}$ in the film forming chamber not introducing the impurity gas connected via the gas gate, the gas separation performance can be determined to be practical, it being found from FIG. 10 that the scavenging gas introducing position is preferably in a range of $0.1 \leq x \leq 0.4$.

Next, the present inventors have investigated the relationship between the pressure difference between the film forming chambers connected via the gas gate and the mixing amount of the impurity gas into the film forming chamber at the lower pressure side, by changing the pressure of the film forming chamber at the higher pressure side from 0.05 Torr to 1.3 Torr, with the scavenging gas introducing position fixed at a position on the film forming chamber side for introducing the impurity gas with x=0.25, using the same apparatus.

Figure 11:
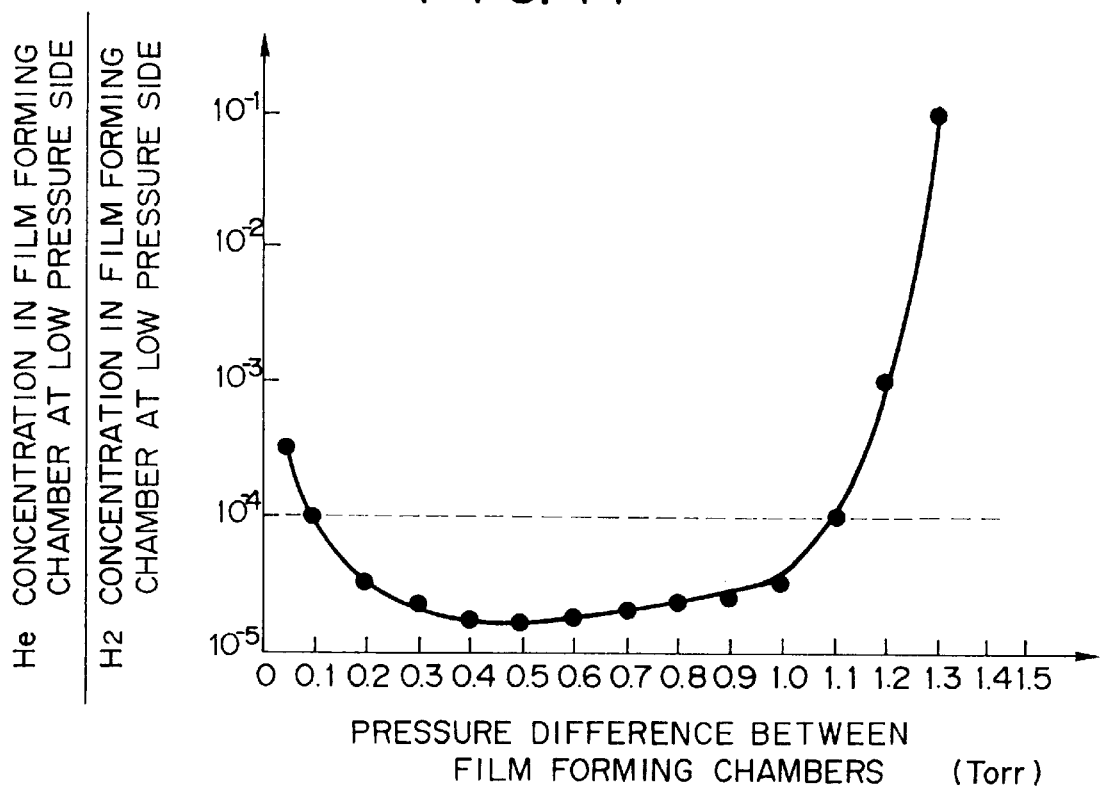
FIG. 11 is a graphic representation between the pressure difference between film forming chambers connected via the gas gate and the gas separation performance.

As a result, the mixing amount of the impurity gas into the film forming chamber at the lower pressure side relative to the pressure difference between the film forming chambers has changed as shown in FIG. 11, wherein it can be found that the practical gas separation performance can be obtained for the pressure difference between the film forming chambers in a range from 0.1 to 1.1 Torr, and the pressure difference between the film forming chambers is preferably in a range from 0.1 to 1.1 Torr, and more preferably in a range from 0.2 to 1.0 Torr.

Examples of the scavenging gas to be flowed into the gas gate in the present invention include dilution gases such as Ar, He, Ne, Kr, Xe, Rn, and a dilution gas of the deposited film forming gas such as $H_2$. In order to increase the pressure at the scavenging gas introducing position, it is necessary to select the scavenging gas having large molecular weight if the pressure of the separation passage within the gas gate is in a molecule flow region, or the scavenging gas having large viscosity coefficient if it is in a viscous flow region, whereby the kind of the scavenging gas can be determined in accordance with the forming condition of the deposited film, the gas separation performance required, and the gas exhaust ability of each film forming chamber.

In the present invention, deposited film forming means disposed within the film forming chambers connected via the gas gate may include a variety of means used in forming functional deposited films, involving RF plasma CVD, microwave plasma CVD, sputtering, ion plating, photo assisted CVD, heating CVD, MOCVD, MBE, vacuum vapor deposition, and electron beam vapor deposition.

In the present invention, the impurity gas introduced into the film forming chambers for deposition of n- or p-type layer is a source material for introducing the impurities used for the valence control of the film formed within the film forming chamber, and when the deposited film is a IV-group semiconductor, source materials useful for introducing the impurities may include those which are placed in the gas state at ordinary temperatures and ordinary pressures, or easily gasified at least under the film forming conditions. The starting materials for introduction of such impurities may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, and the like for the introduction of the n-type impurities, and $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, and the like for the introduction of the p-type impurities. One or more compounds containing such impurity elements as above cited may be employed.

Figure 7:
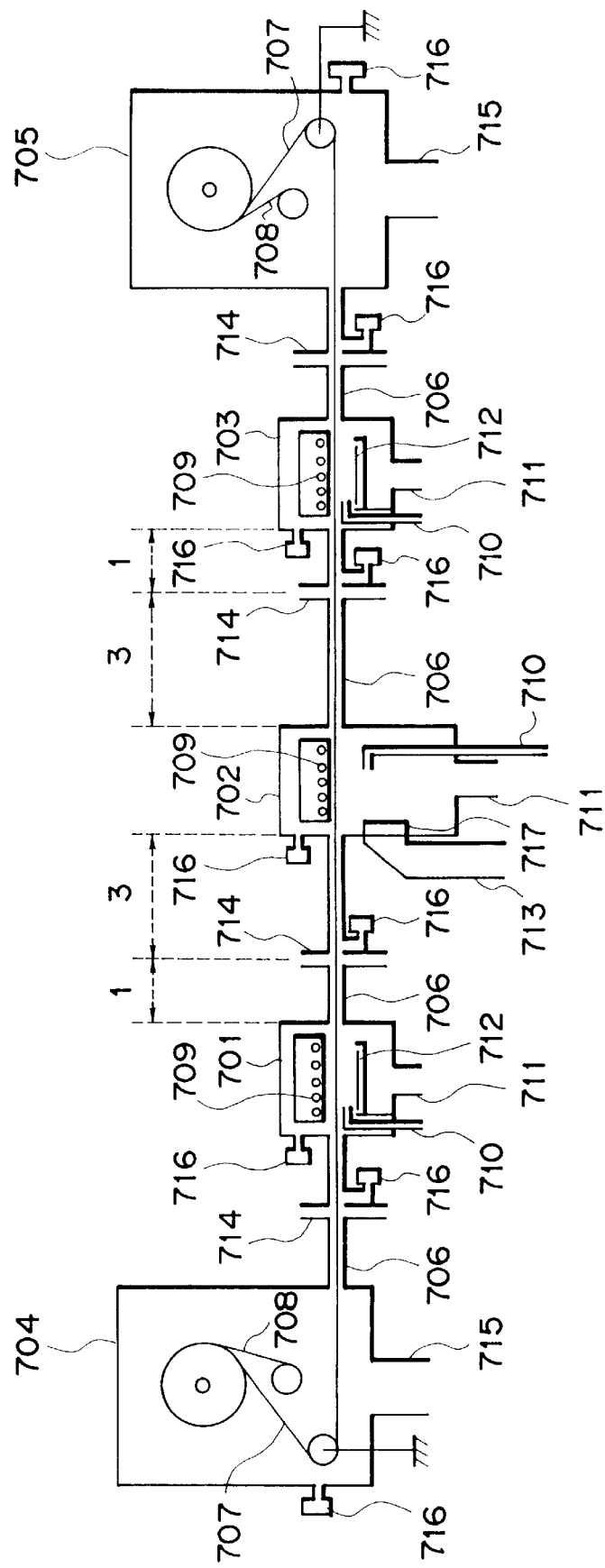
FIG. 7 is a schematic view showing a functional deposited film deposition apparatus for implementing a continuous forming method for functional deposited films according to the present invention.

In order to carry out the continuous forming method for the functional deposited films according to the present invention, an appropriate apparatus can be used, and an example of the constitution of such apparatus is shown in FIG. 7.

In FIG. 7, 701, 703 are film forming chambers for an n- or p-type layer by the RF plasma CVD of 13.56 MHz, 702 is a film forming chamber for an i-type layer by the microwave plasma CVD, 704 is a supply chamber of the strip-like substrate, and 705 is a winding chamber of the strip-like substrate. The film forming chambers for forming the semiconductors of n-type, p-type and i-type conduction type are connected by four gas gates 706. 707 is a strip-like substrate, passing through three film forming chambers as conveyed from the supply chamber of the strip-like substrate to the winding chamber, on the surface of the which are formed functional deposited films of three layers, e.g., semiconductors for a photovoltaic element having a pin junction. Note that 708 is a strip-like sheet composed of heat resistant non-woven fabric, which is wound along with the strip-like substrate to protect the surface of the strip-like substrate.

Each of the film forming chambers 701, 702, 703 is provided with a heater 709 for heating the substrate, an exhaust tube 711 for exhausting the film forming chamber by exhausting means (not shown), a discharge electrode 712 for exciting discharge by supplying energy to the film forming gas within the film forming chamber and applying RF electric power, a wave-guide 713 for supplying the microwave power, and microwave introducing window 717 made of ceramic, wherein the film forming chambers 701, 703 form the n-type and p-type layer deposited films by the RF microwave plasma CVD, respectively, and the film forming chamber 702 forms the i-type layer deposited film by the microwave CVD. The gas gate 706 has a scavenging gas introduced through the scavenging gas introducing tube 714 to prevent the film forming gases from mixing between the adjacent film forming chambers. In the gas gate for connecting between the film forming chamber for deposition of the i-type layer and the film forming chamber for deposition of the n-type layer and the gas gate for connecting between the film forming chamber for deposition of the i-type layer and the film forming chamber for deposition of the p-type layer, the scavenging gas introducing tube 714 is disposed on the side of the film forming chambers for depositing the n-type and p-type layers off the center of the gas gate, for example, at a position where the ratio of its distance to the i-type layer film forming chamber to its distance to the p-type layer film forming chamber is 3:1.

715 is an exhaust tube for exhausting the supply chamber 704 and the winding chamber 705 for the strip-like substrate, 716 is a pressure gauge for measuring the pressure within each film forming chamber 701, 702, 703, and each of the supply chamber 704 and the winding chamber 705 for the strip-like substrate.

Figure 8:
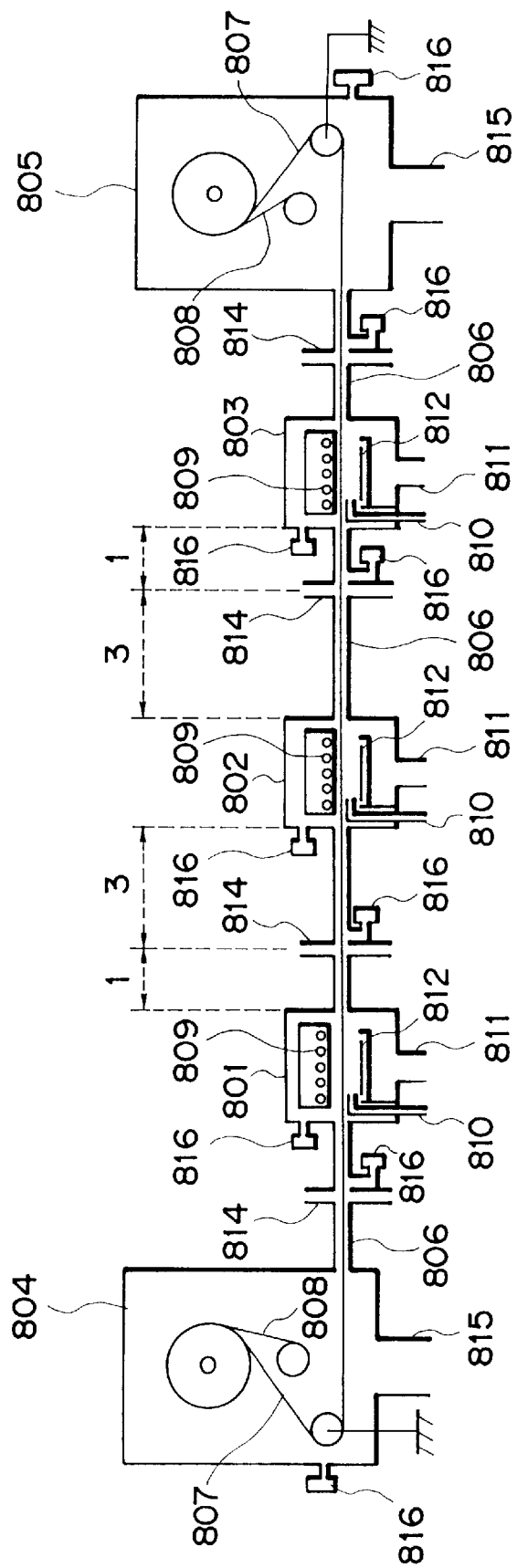
FIG. 8 is a schematic view showing another functional deposited film deposition apparatus for implementing a continuous forming method for functional deposited films according to the present invention.

Another apparatus for carrying out the method of the invention is shown in FIG. 8. The apparatus as shown in FIG. 8 involves the RF plasma CVD as the film depositing method for the film forming chamber for the deposition of the i-type layer, rather than the microwave CVD as shown in FIG. 7. In the figure, 801 to 812 and 814 to 816 correspond to 701 to 712 and 714 to 716 in FIG. 7, respectively.

The present invention will be specifically described below by way of example, to which the present invention is by no means limited.

EXAMPLE 1

Using an apparatus as shown in FIG. 7, n-type, i-type or p-type layer amorphous silicon films are continuously formed on a strip-like substrate by a method of the present invention, according to the following procedure.

First, the strip-like stainless substrate 707 having a width of 30 cm, 50 cm long and 0.2 mm thick, was set to be delivered from the supply chamber 704, passing through three film forming chambers 701, 702, 703, and taken up in the winding chamber 705. Note that the separation passage of a gas gate for connecting between each film forming chamber was all 2 mm in height, 40 cm in length and 31 cm in width. Next, after the vacuum chamber of each chamber was evacuated sufficiently through exhaust tubes 711, 715, a desired film forming gas was introduced through the gas introducing tube 710 into each film forming chamber while further evacuating the vacuum chamber, and the exhaust amount was regulated by checking the pressure gauge 716 so that each film forming chamber was set at a predetermined pressure. The scavenging gas of Ar was introduced each half into upper and lower portions of the gas gate 706 by each 500 sccm. The gas introducing tube 714 is disposed at a position with the distance ratio of 1:3, closer to the n- or p-type layer film forming chamber, for the gas gates connecting between the i-type layer film forming chamber and the n-type and p-type layer film forming chambers, and at the central position of the gas gate for other gas gates.

At this point, the pressure of each chamber was 0.500 Torr at 704, 0.500 Torr at 701, 0.005 Torr at 702, 0.500 Torr at 703, and 0.500 Torr at 705, with some pressure difference between the film forming chambers 701, 702, and between the film forming chambers 702, 703. In the state of introducing the scavenging gas, the measurement of the pressure in the separation passage within the gas gate connecting these film forming chambers, using a pressure gauge provided at the scavenging gas introducing position, showed that the pressure at the scavenging gas introducing position between the film forming chambers 701, 702 and between 702, 703 was each 0.520 Torr, which was higher than the pressure at the aperture end of each film forming chamber, i.e., 0.500 Torr and 0.005 Torr, wherein it could be confirmed that the pressure of the separation passage of the gas gate was at maximum at the scavenging gas introducing position.

The strip-like substrate 707 was heated from the back side thereof by a heater 709 up to a predetermined temperature, a plasma discharge was excited within each film forming chamber by introducing RF power from the discharge electrode 712 and microwave power from the waveguide 713 to continuously form n-, i- or p-type amorphous silicon film on the strip-like substrate while conveying the strip-like substrate at a constant speed. The fabrication conditions within each film forming chamber are listed in Table 1.

TABLE 1

| Film forming chamber | Layer thickness of deposited film (Å) | Gas flow (sccm) | Pressure (Torr) | Discharge power (W) | Heating temperature (°C.) | Deposition rate (Å/s) |
|---|---|---|---|---|---|---|
| 701 | n-type amorphous silicon (200) | SiH$_4$: 50 PH$_3$: 0.5 H$_2$: 200 | 0.5 | RF (100) | 350 | 3 |
| 702 | i-type amorphous silicon (4000) | SiH$_4$: 400 H$_2$: 1000 | 0.005 | microwave (800) | 350 | 150 |
| 703 | p-type amorphous | SiH$_4$: 50 B$_2$H$_6$: 0.5 | 0.5 | RF (100) | 300 | 3 |

TABLE 1-continued

| Film forming chamber | Layer thickness of deposited film (Å) | Gas flow (sccm) | Discharge Pressure (Torr) | Discharge power (W) | Heating temperature (°C.) | Deposition rate (Å/s) |
|---|---|---|---|---|---|---|
| | silicon (100) | $H_2$: 200 | | | | |

Figure 9:
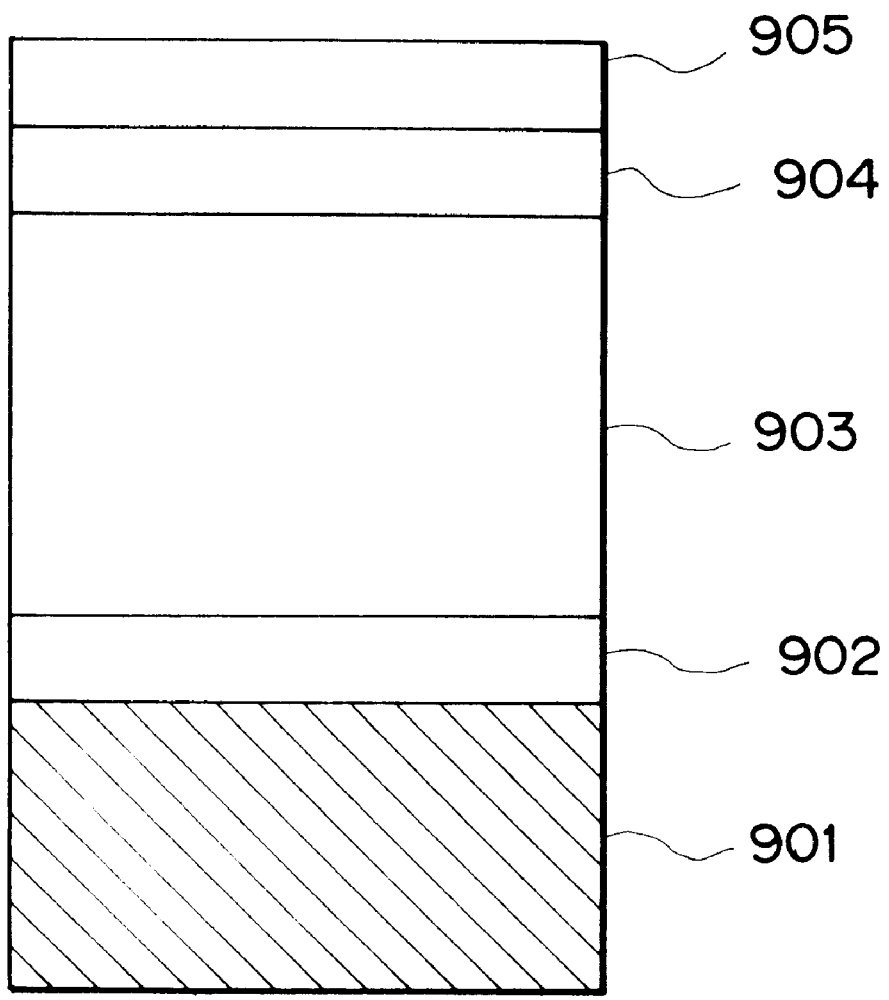
FIG. 9 is a schematic cross-sectional view showing the layer configuration of a photovoltaic element fabricated by carrying out the method of the present invention.

The strip-like substrate having amorphous silicon film obtained by the above method deposited thereon was delivered from a roll-to-roll unit, divided into pieces of 9 cm×30 cm in size, and placed within a vacuum vapor deposition device of single chamber, and an ITO transparent conductive film was laminated by vacuum vapor deposition under the conditions as indicated by Table 2 to fabricate a photovoltaic element as shown in the schematic cross-sectional view of FIG. 9. In FIG. 9, 901 is a substrate, 902 is an n-type layer, 903 is an i-type layer, 904 is a p-type layer, and 905 is an ITO transparent conductive film.

TABLE 2

| Vapor deposition source (composition ratio) | Vapor deposition atmosphere | Strip heating temperature (° C.) | Vapor deposition rate (Å/s) | Thickness of vapor deposited film (Å) |
|---|---|---|---|---|
| In—Sn alloy (50:50) | $O_2$:3 × $10^{-4}$ Torr | 180 | 2 | 700 |

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. Also, the measurement for the distribution of impurities in a film thickness direction by a secondary ion mass spectrometry (SIMS) showed that no mixture of n-layer P atoms and p-layer B atoms into the i-layer was observed, so that film forming gases within adjacent film forming chambers via the gas gate could be substantially completely separated.

COMPARATIVE EXAMPLE 1

A photovoltaic element was fabricated by continuously forming n-, i- and p-type amorphous silicon films on a strip-like substrate in the same way as in the example 1, except that the position of introducing the scavenging gas into the gas gate connecting the i-type layer film forming chamber and the n- or p-type layer film forming chamber was set at the center of the gas gate. At this point, the pressure of each chamber was 0.500 Torr at 704, 0.500 Torr at 701, 0.005 Torr at 702, 0.500 Torr at 703, and 0.500 Torr at 705, with some pressure difference between the film forming chambers 701, 702, and between the film forming chambers 702, 703. In the state of introducing the scavenging gas, the measurement of the pressure in the separation passage within the gas gate connecting these film forming chambers, using a pressure gauge 716 provided at the scavenging gas introducing position, showed that the pressure at the scavenging gas introducing position was each 0.450 Torr, which was higher than the pressure at the aperture ends of the n- and p-type layer film forming chambers 701, 703, or 0.500 Torr.

The measurement for the photoelectric conversion efficiency for the photovoltaic element thus obtained showed only an efficiency of about 60% relative to that of the example 1. Also, the measurement for the distribution of impurities in a film thickness direction by a secondary ion mass spectrometry (SIMS) showed that the mixture of n-layer P atoms and p-layer B atoms into the i-layer was observed.

EXAMPLE 2

A photovoltaic element was fabricated by continuously forming n-, i- and p-type amorphous silicon films on a strip-like substrate in the same way as in the example 1, except that the scavenging gas used $H_2$, instead of Ar, and the scavenging gas introducing amount was 1000 sccm. At this point, the pressure of each chamber was 0.500 Torr at 704, 0.500 Torr at 701, 0.005 Torr at 702, 0.500 Torr at 703, and 0.500 Torr at 705, with some pressure difference between the film forming chambers 701, 702, and between the film forming chambers 702, 703. In the state of introducing the scavenging gas, the measurement of the pressure in the separation passage within the gas gate connecting these film forming chambers, using a pressure gauge provided at the scavenging gas introducing position, showed that the pressure at the scavenging gas introducing position was each 0.510 Torr, which was higher than the pressure at the aperture end of each film forming chamber 701, 703 of the n- or p-type layer, or 0.500 Torr.

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. The measurement for the distribution of impurities in a film thickness direction by a secondary ion mass spectrometry (SIMS) showed that no mixture of n-layer P atoms and p-layer B atoms into the i-layer was observed, so that film forming gases within adjacent film forming chambers via the gas gate could be substantially completely separated.

COMPARATIVE EXAMPLE 2

A photovoltaic element was fabricated by continuously forming n-, i- and p-type amorphous silicon films on a strip-like substrate in the same way as in the example 2, except that the position of introducing the scavenging gas into the gas gate connecting the i-type layer film forming chamber and the n- or p-type layer film forming chamber was set at the center of the gas gate. At this point, the pressure of each chamber was 0.500 Torr at 704, 0.500 Torr at 701, 0.005 Torr at 702, 0.500 Torr at 703, and 0.500 Torr at 705, with some pressure difference between the film forming chambers 701, 702, and between the film forming chambers 702, 703. In the state of introducing the scavenging gas, the measurement of the pressure in the separation passage within the gas gate connecting these film forming chambers, using a pressure gauge 716 provided at the scavenging gas introducing position, showed that the pressure at the scavenging gas introducing position was each 0.440 Torr, which was higher than the pressure at the aperture ends of the n- and p-type and layer film forming chambers 701, 703, or 0.500 Torr.

The measurement for the photoelectric conversion efficiency for the photovoltaic element thus obtained showed only an efficiency of about 60% relative to that of the example 2.

Also, the measurement for the distribution of impurities in a film thickness direction by a secondary ion mass spectrometry (SIMS) showed that the mixture of n-layer P atoms and p-layer B atoms into the i-layer was observed.

EXAMPLE 3

Using an apparatus as shown in FIG. 8, amorphous silicon films of n-, i- and p-type conductive layers were continuously formed on a strip-like substrate by a method of the present invention, according to the following procedure.

First, a strip-like stainless substrate 807 having a width of 30 cm, 50 cm long and 0.2 mm thick, was set to be delivered from a supply chamber 804, passing through three film forming chambers 801, 802, 803, and taken up in a winding chamber 805. Note that the separation passage of a gas gate for connecting between each film forming chamber was all 3 mm in height, 40 cm in length and 31 cm in width.

Next, after the vacuum chamber of each chamber was evacuated sufficiently through exhaust tubes 811, 815, a respective film forming gas was introduced through a gas introducing tube 810 into each film forming chamber while further evacuating the vacuum chamber, and the exhaust amount was regulated by checking a pressure gauge 816 so that each film forming chamber was set at a predetermined pressure. The scavenging gas of He was introduced each half into upper and lower portions of the gas gate by each 500 sccm. The scavenging gas introducing tube 814 was disposed at a position of the distance ratio of 1:3, closer to the n- or p-type layer film forming chamber, for the gas gates connecting between the i-type layer film forming chamber and the n-type or p-type layer film forming chamber, and at the center of the gas gate for other gas gates.

At this point, the pressure of each chamber was 0.750 Torr at 804, 0.750 Torr at 801, 0.300 Torr at 802, 0.750 Torr at 803, and 0.750 Torr at 805, with some pressure difference between the film forming chambers 801, 802, and between the film forming chambers 802, 803. In the state of introducing the scavenging gas, the measurement of the pressure in the separation passage within the gas gate connecting these film forming chambers, using a pressure gauge provided at the scavenging gas introducing position, showed that the pressure at the scavenging gas introducing position between the film forming chambers 801, 802 and between 802, 803 was each 0.760 Torr, which was higher than the pressure at the aperture end of each film forming chamber, i.e., 0.750 Torr and 0.300 Torr, wherein it could be confirmed that the pressure of the separation passage of the gas gate was at maximum at the scavenging gas introducing position.

The strip-like substrate 807 was heated from the back side thereof by a heater 809 up to a predetermined temperature, plasma discharge was excited within each film forming chamber by introducing RF power from a discharge electrode 812 to continuously form amorphous silicon films of n-, i- or p-type conductive layer on the strip-like substrate, while conveying the strip-like substrate at a constant speed. The fabrication conditions within each film forming chamber are listed in Table 3.

TABLE 3

| Film forming chamber | Layer thickness of deposited film (Å) | Gas flow (sccm) | Pressure (Torr) | Discharge power (W) | Heating temperature (°C.) | Deposition rate (Å/s) |
|---|---|---|---|---|---|---|
| 701 | n-type amorphous silicon (200) | $SiH_4$: 50 $PH_3$: 0.5 $H_2$: 200 | 0.75 | RF (100) | 350 | 2 |
| 702 | i-type amorphous silicon (4000) | $SiH_4$: 400 $H_2$: 1000 | 0.3 | RF (800) | 350 | 20 |
| 703 | p-type amorphous silicon (100) | $SiH_4$: 50 $B_2H_6$: 0.5 $H_2$: 200 | 0.75 | RF (100) | 300 | 1 |

The strip-like substrate having the amorphous silicone film obtained by the above method deposited thereon was delivered from a roll-to-roll unit, divided into pieces of 9 cm×30 cm in size, and placed within a vacuum vapor deposition device of a single chamber, and an ITO transparent conductive film was laminated by vacuum vapor deposition under the conditions as indicated by Table 2 to fabricate a photovoltaic element as shown in the schematic cross-sectional view of FIG. 9.

The photovoltaic element thus obtained indicated an excellent photoelectric conversion efficiency equivalent to that of a photovoltaic element as fabricated by a deposited film forming apparatus of three chamber isolation type in which each film forming chamber is completely isolated by a gate valve. Also, the measurement for the distribution of impurities in a film thickness direction by a secondary ion mass spectrometry (SIMS) showed that no mixture of n-layer P atoms and p-layer B atoms into the i-layer was observed, so that film forming gases within the adjacent film forming chambers via the gas gate could be substantially completely separated.

As above described, with the continuous forming method and apparatus for functional deposited films according to the present invention, a plurality of processes having quite different pressures suitable for the film formation can be incorporated into a series of the roll to roll system without any mutual mixture of gases between adjacent film forming chambers, so that it is possible to achieve the continuous formation for functional deposited films with high producibility.

What is claimed is:

1. A deposited film forming method in which each of single deposited films is deposited on a substrate, said substrate continuously moving longitudinally through a plurality of film forming chambers, each of said chambers has a pressure different from the immediately adjacent chamber and a gas gate in a passage between each of said film forming chambers, said passage connecting each of said film forming chambers, said method comprising the steps of:

connecting said plurality of chambers via each of said gas gates so as to maintain a lower pressure in a film forming chamber forming a substantially intrinsic semiconductor layer than the pressure in a film forming chamber forming a p or n type semiconductor layer, said plurality of film forming chambers being disposed in a group of three with the film forming chamber for forming the substantially intrinsic semiconductor film being located between a first film forming chamber for forming p or n type semiconductor film and a second film forming chamber for forming a p or n type semiconductor film, each of said film forming chambers being connected via each of said gas gates;

moving said substrate continuously longitudinally through each of said plurality of film forming chambers so as to pass from one pressure chamber to another chamber having a different pressure;

introducing a scavenger gas at a position located off the center of said gas gate closer to the side of the film forming chamber having the higher pressure; and introducing source raw material gases into the plurality of the film forming chambers to form said substantially intrinsic semiconductor and p or n type semiconductor films.

2. A deposited film forming method according to claim 1, wherein said deposited film forming method in said plurality of film forming chambers is selected from the group consisting of an RF plasma CVD method, a microwave plasma CVD method, a sputtering method, an ion plating method, a photo assisted CVD method, a thermal CVD method, a MOCVD method, a MBE method, and a vacuum CVD method.

3. A deposited film forming method according to claim 1, wherein the pressure difference between said film forming chamber having a lower pressure and said film forming chamber having a higher pressure is from 0.1 Torr to 1.1 Torr.

4. A deposited film forming method according to claim 1, wherein the pressure difference between said film forming chamber having a higher pressure than said film forming chamber having a lower pressure is from 0.2 Torr to 1.0 Torr.

5. A deposited film forming method according to claim 1, wherein the ratio of distance from the position of the scavenger gas introduction to the aperture of the film forming chamber, having a pressure higher than the film forming chamber having the lower pressure relative to the total length of the gas gate in the substrate conveying direction is from 0.1 to 0.4.

6. A deposited film forming method according to claim 1, wherein said scavenger gas is at least one gas selected from the group consisting of Ar gas, He gas, Ne gas, Kr gas, Xe gas, Rn gas and $H_2$ gas.

7. A deposited film forming method according to claim 1, wherein a gas forming a semiconductor of p-type conductivity is a gas selected from the group consisting of $BF_3$, $BCl_3$, $BBr_3$, $B_2H_6$, $B_4H_{10}$, $B_5H_9$, $B_5H_{10}$, $B_6H_{10}$, $B_6H_{11}$, $B_6H_{12}$, and $AlCl_3$.

8. A deposited film forming method according to claim 1, wherein a gas forming a semiconductor of n-type conductivity is a gas selected from the group consisting of $PH_3$, $P_2F_4$, $PF_3$, $PF_5$, $PCl_3$, $AsH_3$, $AsH_5$, $AsF_5$, $AsCl_3$, $SbH_3$, $SbF_6$, and $BiH_3$.

9. A deposited film forming method according to claim 1, wherein said deposited films are formed in said film forming chamber having a lower pressure by a microwave plasma CVD method and said deposited films are formed in said film forming chamber having higher pressure by an RF plasma CVD method.

10. A deposited film forming method according to claim 1, wherein the scavenger gas introduced into said gas gate is exhausted through the film forming chambers adjacent to said gas gate.

11. A deposited film forming method for depositing a multilayer of deposited films onto a substrate using a deposited film deposition apparatus comprising a film forming chamber forming an intrinsic semiconductor film disposed between, a first film forming chamber forming a p or n type semiconductor film, and a second film forming chamber forming a p or n type semiconductor film, a gas gate with a slit shaped separation passage for connection between said film forming chambers, means to continuously move said substrate longitudinally through each of said film forming chambers and said gas gate, gas introducing means for introducing a scavenger gas into said gas gate, and means to deposit said films onto said substrate in each of said film forming chambers, said method comprising the steps of:

introducing a source raw material gas into each of said film forming chambers to form said substantially intrinsic semiconductor film and said p or n type semiconductor film so as to maintain lower pressure in the film forming chamber forming the substantially intrinsic semiconductor film than pressure in the film forming chamber forming the p or n type semiconductor film;

moving said substrate through said passage between said film forming chambers;

introducing a scavenger gas at a position located off the center of the slit shaped separation passage of said gas gate between the film forming chambers, said position being closer to the film forming chamber forming said p or n type semiconductor film;

introducing a source raw material gas into each of said film forming chambers; and applying energy to the source raw material gas in each of said film forming chamber so as to form the deposited films onto said substrate.

12. A deposited film forming method according to claim 11, wherein the introduction of said scavenger gas is performed so as to satisfy the relationship $$0.1 \leq \frac{C'' - C}{C''} \leq 0.4.$$

where $C''$ is conductance in the slit shaped seperation passage of the gas gate from the position of the scavenger gas introduction to the film forming chamber at a lower pressure, and C is conductance for the gas gate through its entire length.

13. A deposited film forming method according to claim 11, wherein the deposited films are formed while said substrate is moved.

14. A deposited film forming method according to claim 11, wherein said deposited films are deposited onto said substrate by a method selected from the group consisting of an RF plasma CVD method, a microwave plasma CVD method, a sputtering method, an ion plating method, a photo assisted CVD method, a thermal CVD method, an MOCVD method, an MEB method, a vacuum vapor deposition method, and an electron beam vapor deposition method.

15. A deposited film forming method according to claim 11, wherein the pressure difference between said film forming chambers is maintained from 0.1 to 1.1 Torr.

16. A deposited film forming method according to claim 11, wherein the pressure difference between said film forming chambers is maintained from 0.2 to 1.0 Torr.

17. A deposited film forming method according to claim 11, wherein said scavenging gas is introduced at a position where the ratio of distance from the center of the gas gate relative to the total length of the gas gate in a substrate conveying direction is from 0.1 to 0.4.

18. A deposited film forming method according to claim 11, wherein said deposited film is formed on said substrate using microwave in the film forming chamber forming said intrinsic semiconductor film.

19. A deposited film forming method according to claim 11, wherein said deposited film is formed on said substrate using RF wave in the film forming chamber forming said, p or n type semiconductor film.

20. A deposited film forming method according to claim 11, wherein said source raw material gas introduced into the film forming chamber forming said n or p type semiconductor film includes at least a gas for supplying an impurity.

21. A deposited film forming method according to claim 11, wherein the intrinsic semiconductor deposited film is formed in the film forming chamber for forming said intrinsic semiconductor film after the p or n type semiconductor deposited film is formed on said substrate in the film forming chamber for forming said p or n type semiconductor film.

22. A deposited film forming method according to claim 11, wherein the p or n type semiconductor deposited film is formed in the film forming chamber for forming said p or n type semiconductor film after the intrinsic semiconductor deposited film is formed on said substrate in the film forming chamber for forming said intrinsic semiconductor film.

23. A deposited film forming method according to claim 11, wherein the intrinsic semiconductor deposited film is formed in the film forming chamber for forming said intrinsic semiconductor film after the p or n-type semiconductor deposited film is formed on said substrate in the film forming chamber forming said p or n type semiconductor film, and thereafter p or n type semiconductor deposited film is formed in the second film forming chamber forming said p or n type semiconductor film which differs in a conductivity type from said p or n type semiconductor film deposited in said first film forming chamber forming said p or n type semiconductor film.

24. A deposited film forming method according to claim 11, wherein the scavenger gas introduced into said gas gate is exhausted through the film forming chambers adjacent to said gas gate.

* * * * *

UNITED STATES PATENT AND TRADEMARK OFFICE
CERTIFICATE OF CORRECTION

PATENT NO.    : 5,946,587
DATED         : August 31, 1999
INVENTOR(S)   : Yasushi Fujioka et al.

It is certified that error appears in the above-identified patent and that said Letters Patent is hereby corrected as shown below:

<u>Title page,</u>
Item [56], References Cited, FOREIGN PATENT DOCUMENTS,
"0330419 2/1991 Japan." should read -- 3-30419 2/1991 Japan. --.

<u>Column 1,</u>
Line 23, "valve" should read -- valve, --.;
Line 25, "These" should read -- These completely separated --.

<u>Column 2,</u>
Line 9, "first deposited" should read -- first and second reaction vessels, and between the second and third reaction vessels, separating means is provided for preventing an element constituting the p-type semiconductor layer and an element constituting the n-type semiconductor layer from mixing into the second reaction vessel, respectively, with the pressure of the second reaction vessel made higher than those of the first and third reaction vessels to effect the operation. The use of such continuous film forming apparatus allows a plurality of semiconductor layers having different compositions to be continuously laid down one over the other. The separating means is to isolate the adjacent reaction vessels from each other by providing a predetermined difference in internal pressure between the adjacent reaction vessels, thereby preventing the mutual diffusion of source gases for use in the reaction vessels. In this case, however, there is a problem with the separating means. There is a passage for the striplike substrate provided through the adjacent reaction vessel, through which a source gas within the reaction vessel of the higher internal pressure inevitably mixes into the reaction vessel of the lower internal pressure. This causes variations in the internal pressure within the latter reaction vessel, as well as in the plasma excited within the reaction vessel, so that it is difficult to form desired deposited --;
Line 31, "and second reaction" should be deleted;
Lines 32-53, should be deleted;
Line 54, "reaction vessel, so that it is difficult to form desired" should be deleted.

UNITED STATES PATENT AND TRADEMARK OFFICE
CERTIFICATE OF CORRECTION

PATENT NO. : 5,946,587
DATED : August 31, 1999
INVENTOR(S) : Yasushi Fujioka et al.

It is certified that error appears in the above-identified patent and that said Letters Patent is hereby corrected as shown below:

Column 4,
Line 3, "so as" should be deleted;
Line 64, "is preferred to 1.0 Torr." should read -- to 1.0 Torr is preferred. --.

Column 7,
Line 12, "flows" should read -- flows, --.

Column 9,
Line 67, "more" should read -- more of --.

Column 18,
Line 43, "silicone" should read -- silicon --.

Column 20,
Line 60, "seperation" should read -- separation --.

Column 21,
Line 26, "said," should read -- said --.

Signed and Sealed this

Sixth Day of August, 2002

Attest:

Attesting Officer

JAMES E. ROGAN
Director of the United States Patent and Trademark Office